(12) United States Patent
Steiert et al.

(10) Patent No.: US 6,788,546 B1
(45) Date of Patent: Sep. 7, 2004

(54) MULTI-CHIP MODULE

(75) Inventors: Philippe Steiert, Greppen (CH); Gerhard Staufert, Zofingen (CH)

(73) Assignee: Elmicron AG, Sachseln (CH)

( * ) Notice: Subject to any disclaimer, the term of this patent is extended or adjusted under 35 U.S.C. 154(b) by 0 days.

(21) Appl. No.: 09/936,962

(22) PCT Filed: Mar. 17, 2000

(86) PCT No.: PCT/EP00/02404
§ 371 (c)(1),
(2), (4) Date: Dec. 27, 2001

(87) PCT Pub. No.: WO00/57474
PCT Pub. Date: Sep. 28, 2000

(30) Foreign Application Priority Data

Mar. 19, 1999 (DE) .......................... 199 12 441

(51) Int. Cl.[7] .............................. H05K 7/02; H05K 7/06; H05K 7/08; H05K 7/10
(52) U.S. Cl. .................. 361/760; 361/777; 361/782
(58) Field of Search ................. 361/688–690, 361/704–707, 719–720, 781–782, 806–811, 760, 777; 439/76.1–76.2; 257/666–668, 723–724

(56) References Cited

U.S. PATENT DOCUMENTS

| | | | |
|---|---|---|---|
| 4,890,157 A | * 12/1989 | Wilson | 257/668 |
| 5,001,604 A | * 3/1991 | Lusby | 361/749 |
| 5,159,532 A | 10/1992 | Kilian et al. | |
| 5,434,362 A | * 7/1995 | Klosowiak et al. | 174/254 |
| 5,444,297 A | 8/1995 | Oshima et al. | |
| 5,604,674 A | 2/1997 | Terasawa | |
| 5,703,399 A | * 12/1997 | Majumdar et al. | 257/723 |
| 5,998,856 A | * 12/1999 | Noda et al. | 257/666 |
| 6,129,560 A | * 10/2000 | Baur et al. | 439/76.1 |

FOREIGN PATENT DOCUMENTS

EP 0 751 570 A2 1/1997

OTHER PUBLICATIONS

Shigekane H et al: "High Power Transistor Modules With Intelligent Functions", Proceedings of the International Symposium on Power Semiconductor Devices and ICS, 1990, XP002058955, figure 6A.
Japanese Patent Abstract, "Manufacture of Semiconductor Device", JP2238629, Publication Date: Sep. 20, 1990.

* cited by examiner

Primary Examiner—Kamand Cuneo
Assistant Examiner—Tuan Dinh
(74) Attorney, Agent, or Firm—Rankin, Hill, Porter & Clark LLP

(57) ABSTRACT

The invention is related to a multi-chip-module and to a method for its manufacture. The module comprises a base carrier, on which at least in some areas signal conductor tracks and signal contact surfaces arranged at least in a single layer are located, and with at least one semiconductor component operating in the signal range and connected with the signal conductor track and signal contact surfaces. The purpose is to achieve a high degree of integration with a multi-chip-module of this type. To do so, in addition at least in some areas on the base carrier power conductor tracks and power contact surfaces arranged in at least one layer are located. Furthermore, at least one power electronics component operating in the power range is provided, which is connected with at least one power conductor track, at least one power contact surface and at least one signal conductor track. The power conductor tracks have a larger cross section than the signal conductor tracks at least on the basis of greater thickness dimensions.

15 Claims, 4 Drawing Sheets

MULTI-CHIP MODULE

BACKGROUND OF THE INVENTION

1. Field of the Invention

The invention presented here relates to a multi-chip-module with a base carrier, on which at least in some areas signal conductor tracks and signal contact surfaces are arranged in a single layer, and with at least one semiconductor component operating in the signal range connected with signal conductor tracks and signal contact surfaces.

2. Description of Related Art

Multi-chip-modules (MCM) in prior art serve for the highly integrated arrangement of semiconductor components operated in the signal range (i.e., computer components, memory components, I-O components, etc.). MCMs of this type comprise very fine structures of conductor tracks and contact surfaces, wherein semiconductor components mostly present in the form of unhoused chips are connected with the contact surfaces. Several of these semiconductor components are arranged on a common base carrier. Within the technology, a series of differing designs of such MCMs exist, mentioned as examples shall be solely the EP 0871222 A2, WO 97/22138, WO 97/20273 and EP 0856888 A2. Multi-chip-modules of this type, for example, are arranged on printed circuit boards and contacted through corresponding supply lines of the printed circuit board. Common to all known MCMs, however, is that they exclusively relate to the combination of digital and/or analogue semiconductor components, which are operated with electric powers in the signal range and which, as a rule, are utilised for the outputting of control signals. The conductor tracks and contact surfaces have a small cross section and can be arranged in a single layer or multiple layers on a suitable carrier material, so that, depending on the case in question, a structure in the sense of an MCM-L, an MCM-C or an MCM-D is present. These types, which are designated in such a manner in the specialist literature, differ from one another with respect to the carrier material and the lateral density of the electrically conductive structure. With these conductor tracks and contact surfaces of small cross section, the desired signal semiconductor components, which can be present as unhoused chips or as "chip-packed devices" or as SMD component, etc., are capable of being contacted. MCMs of this type are also utilised for controlling of semiconductor components with electric powers from a few Watts to some kilowatts, in that electric control signals with a low power are applied to corresponding inputs of these semiconductor components. In the fields of the controlled electric power supply of medium to high power, e.g., in the case of small electric motors, electro-pneumatic modules, motors for machine tools, motors for automobiles and right through to locomotive motors, no complete electric isolation of signal circuit and power circuit has to be present.

In other fields of application, such as in telecommunications, a strict electric isolation of the driving primary circuit from the secondary circuit conducting the electric power is demanded. In such a case, electronic components, such as switching relays, reed relays, etc., are employed which, on the basis of more recent developments, are becoming smaller and smaller in their dimensions.

In particular in the field of small automatic units (small robots, automatic assembly units, etc.), but also, however, in the field of telecommunications, it has proven to be a problem that the electronic structures necessary for the operation of the unit, still have a disruptively large volume and, on the other hand, the operational reliability is limited by the terminals, plugs and other devices for creating electric contact between two structurally independent components.

SUMMARY OF THE INVENTION

The present invention is therefore directed toward making available a highly integrated circuit layout in the case of an MCM with a base carrier, on which at least in some areas signal conductor tracks and signal contact surfaces are arranged in a single layer, and with at least one semiconductor component operating in the signal range connected with signal conductor tracks and signal contact surfaces.

This objective is achieved in the case of a multi-chip-module by the fact that, on the base carrier, at least in some areas power conductor tracks and power contact surfaces arranged in a single-layer are provided, at least one power electronics component operating in the power range is provided, which is connected with the at least one power conductor track, at least one power contact surface and at least one signal conductor track, and that the power conductor tracks have a larger cross section that the signal conductor tracks at least on the basis of greater thickness dimensions. The comparison of cross sections preferably shall not refer to the overall cross section of all conductor tracks, but shall be refer to the individual cross section of the respective conductor track.

It is known from the printed circuit board technology to equip a base carrier with a conductive layer and, subsequently by means of photo-lithography, to create a conductor track structure on this carrier, wherein conductors of differing cross sections can be produced by differing conductor track widths. However, this process cannot be transferred to the production of very much smaller and, for this reason, very much more finely structured MCMs. Because of the excessive widening of conductor tracks for the purpose of obtaining a suitable cross section, the high integration on an MCM would not be implementable.

In contrast to this, in accordance with the invention it is proposed to arrange power electronics components, which in the meantime are also available in small format, which are operated with a much higher power than the signal semiconductor components, on one and the same base carrier as the signal control system. This is implemented by conductor tracks with a greater thickness than the respectively thinner signal conductor tracks. By means of this, the power conductor tracks can also be arranged very close together, as a result of which high integration can take place on the common base carrier. In addition, the integration of driving electronics and power electronics on an MCM provides the opportunity to offer the users "intelligent power electronics components". Therefore on the same carrier in addition to the conductors with a small cross section, conductors and contact surfaces with a large cross section are present, by means of which the required power electronics components (power semiconductors, relays, etc.) can be contacted. From the zone with the conductors of a small cross section, special conductors lead into the zone with conductors with a large cross section, which are able to transmit the corresponding control signals between the signal semiconductor and the power semiconductors. With this, in the smallest possible space and without any connecting elements susceptible to malfunction, a driving of the power electronics components with signal semiconductors is implemented.

Furthermore, there is the possibility that the at least one signal conductor track leading to a power electronics component essentially seamlessly verges into a power conductor track and/or power contact surface. If the same materials are utilised for the power electronic conductor tracks and the signal conductor tracks, then on the basis of suitable manufacturing methods a tight bond of these conductor tracks is produced, which is superior to all other contacting methods. The control signal therefore can be transmitted to the power electronics components with the utmost precision and without any interference, Connecting elements susceptible to malfunction, such as solder points, are therefore superfluous.

Methods mastered up until now have shown that the ratio of the height of a power conductor track and/or power contact surfaces to the height of a signal conductor track and/or signal contact surface is situated within the range of 2 to 300, preferably in a ratio of 20 to 180. On the basis of such a significant difference it is possible to put much higher powers through the power conductor tracks than through the signal conductor tracks, without a large lateral space being required for different power conductor tracks or power contact surfaces.

In preference, in this context the ratio of conductor cross section of power conductor track and/or power contact surface to the conductor cross section of a signal conductor track may amount to 2 to 1000, in preference 80 to 400. Here too it becomes clear that, on the basis of the enormously enlarged cross section, the power capacity differences of the conductor tracks in the signal range and in the power range can be considerable.

An also preferred ratio of height to width of a power conductor track and/or power contact surface in the case of one embodiment is situated in the range of 0.1 to 10, preferably 1 to 4. By means of a combination of widening and increasing the height of the power conductor track relative to the signal conductor tracks, a compromise is achieved,: which contributes decisively to the high integration on a common base carrier.

In most cases it can be foreseen that at least one power conductor track merges into several power contact surfaces for the purpose of jointly contacting a power electronics component. This signifies, that this conductor track comprises branches (junctions) corresponding to the number of contact surfaces. If the power is distributed over the individual contact surfaces, then these can have a correspondingly smaller cross section.

In order for the MCM to be able to be electrically connected to the outside, in accordance with a further embodiment, signal connection contact surfaces and power connection contact surfaces for a respective external connection are provided, wherein the signal connection contact surfaces and the power connection contact surfaces essentially have the same height. As a result of the same height of these contact surfaces, the layout of the MCM is facilitated, because the contact surfaces additionally can be utilised for the positioning. In the case of correspondingly high contact surfaces, the MCM can be installed head first, so that the components arranged on the base carrier are automatically protected.

Another procedure for the equalisation of the differing heights of signal conductor tracks and power conductor tracks consists in arranging the signal contact surfaces and the power contact surfaces on the side opposite the semiconductor components and power electronics components (reverse side) of the base carrier, wherein the connection contact surfaces are in electrical connection with the opposite side (front side) through the conductor track sections, which pass through the base carrier. On the reverse side of the base carrier, the contact surfaces then can have a relatively low height, independent of the height of the conductor tracks arranged on the front side, wherein the power contact surfaces are designed correspondingly larger. This, however, because of the space conditions prevailing on the reverse side, does not prove to be a disadvantage.

An adequate protection for the power electronics components as well as a relatively flat construction height can be achieved by the value, which results from the height of a power conductor track minus the height of a contact surface in electrical contact with this power conductor track, being the same or greater than the height of the power electronics component contacting this power contact surface. This signifies, that the power conductor tracks protectively surround the electronic components and, because they are higher than them, provide a protection against shocks.

A further important aspect, which is important in the case of an integration of signal circuits and power circuits on an MCM, consists in the adequate heat dissipation. For this purpose it is possible to assure that at least one heat conducting element is provided on the base carrier, which is in a thermally conductive connection with a power electronics component. This heat conducting element then conducts the superfluous beat away from the power electronics component, which thereupon can be dissipated through it in any suitable form.

For this purpose, provisions additionally can favourably be made that at least one heat conducting element is connected with a heat exchanger device. The heat exchanger device then takes care of the corresponding dissipation of the heat in function of the power of the electronics component. Possible as heat exchanger devices are all means in miniature form suitable for this purpose, independent of whether a forced cooling or anything similar is provided. In order to also not excessively burden the front side of the MCM with the heat exchanger equipment, so that a high degree of integration is not impaired by this, it may also be arranged on the reverse side of the base carrier, wherein the heat conducting element passes through the base carrier. The heat conducting element therefore conducts the heat through the base carrier to the heat exchanger device arranged on the reverse side. This has advantages in particular in the case of MCMs installed head first, because the possibly tight installation conditions do not lead to a build-up of beat and because the heat is conducted into regions where an adequate heat exchange can be provided for.

In the case of a variant of the heat exchanger it is foreseen, that it comprises fine cooling ribs with a ratio of height to width of 0.1 to 10, in preference 1 to 4. Cooling ribs of this type are capable of being manufactured in a similar manner as the conductor tracks and therefore they have a relatively large ratio of height to width. This, with relatively small structures, makes it possible to provide very high heat exchange rates.

A further variant consists in the fact that a heat exchanger device is connected with a power electronics component in an immediately thermally conductive manner. A cooling structure of this kind can be directly mounted on the power electronics components by means of correspondingly suitable mans of connection, e.g., a thermally conductive adhesive.

In order to be in a position to assure a standardisation, in accordance with an embodiment provisions are made that the signal contact surfaces and the power contact surfaces are arranged grouped on the base carrier such that the module can be inserted into a standardised base. Here there is also the possibility of grouping the contact surfaces such that bases, which are already present, can be utilised. These then solely have to have suitable contacts at the corresponding points for the connection of the power circuits.

The invention furthermore is related to a method for the manufacture of a multi-chip-module. The method comprises the following steps:

Preparation of a base carrier with signal conductor tracks and signal contact surfaces, deposition of a structured layer, by which at least the signal conductor tracks and signal contact surfaces are essentially covered, except for connection points, and which comprises a negative structure of the power conductor tracks and/or power contact surfaces. Filling in the negative structures by means of a metallisation process for the creation of the power conductor tracks and/or contact power surfaces wherein, at the connection points, a contacting of the signal conductor tracks and/or of the signal contact surfaces and of the power conductor tracks and/or power contact surfaces takes place.

As a result of the separate manufacturing of signal conductor tracks and power conductor tracks, structures with differing heights can be created with relatively simple process steps. The already present signal conductor tracks are covered and, except for suitable contact points, sealed off for the protection from the process steps to follow. The base material used by means of the most differing processes can be equipped with a negative structure, which predetermines the course of the power conductor tracks. In preference, this structure goes right through to the base carrier, so that thereupon a coating of the base carrier in the zone of the negative structure can take place. For the metallisation taking place, also differing processes can be utilised. The structured layer defines the form of the power conductor tracks and corresponding contact surfaces, which are creatable by the metallisation. Thereafter, the structured layer protects the corresponding track and contract structures during the manufacturing process.

In preference, on the base carrier in the zone of the negative structure a conductive adhesive layer can be deposited, which serves as the base for the metallisation process. It is important that an adequate connection between the base carrier and the conductor track structures is produced. This preferably can be implemented by a more expensive adhesive layer, which effects the anchoring in a better manner. The further adhesion is thereupon achievable by means of simple metallisation processes because the adhesive layer possesses a corresponding conductivity.

Favourably, the structured layer can be deposited by means of a photo-lithographic process. Very fine structures with very advantageous ratios of height to width can be manufactured by means of such a process. The designing of conductor tracks and contact surfaces in a shape required is achieved in this manner.

In accordance with a variant of the method, the metallisation process can take place by galvanic deposition of metal. In particular in connection with a conductive adhesive layer, on this layer thereupon the desired structure can be created.

In the case of most applications it will be desirable, that in accordance with a variant, following the metallisation process the structured layer is removed.

BRIEF DESCRIPTION OF THE DRAWINGS

In the following, examples of embodiments of the invention presented here are explained in more detail on the basis of drawings. These illustrate.

DETAILED DESCRIPTION OF THE PREFERRED EMBODIMENTS

Figure 1:
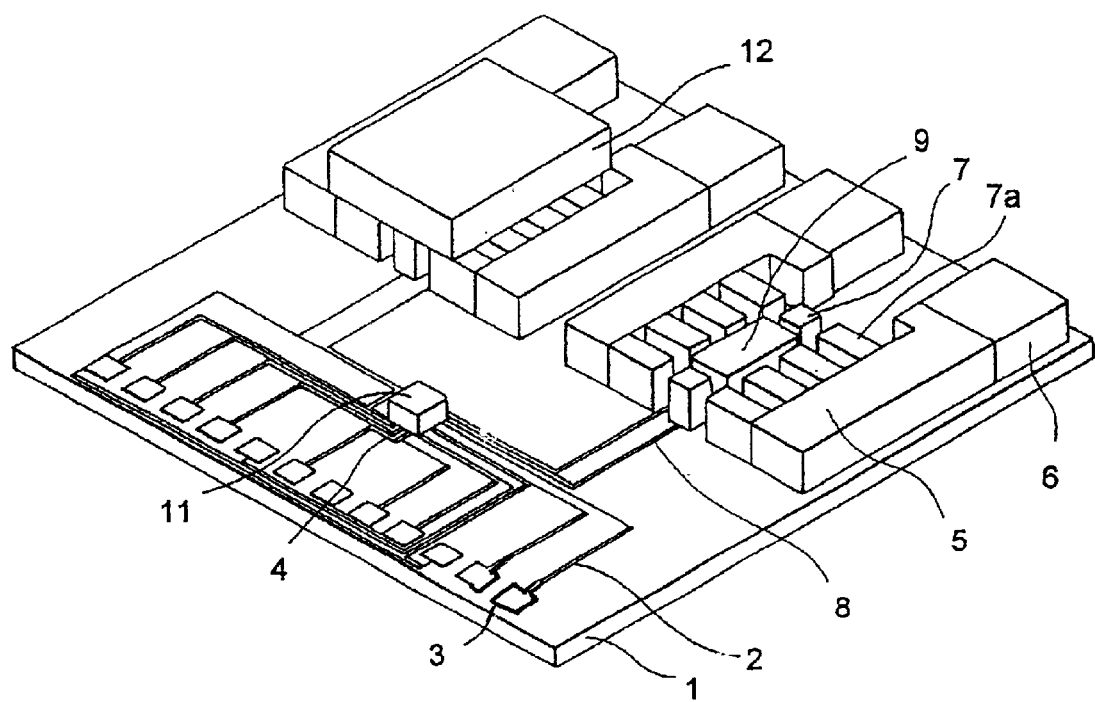
FIG. 1 a first embodiment of an MCM in a perspective view.

The embodiment of an MCM illustrated in FIG. 1 comprises a continuous, plate-shaped base carrier 1, on which very finely structured electrically conductive signal conductor tracks 2 as well as power conductor tracks 5 with a larger cross section are arranged. The signal conductor tracks 2, respectively, lead to a signal contact surface 3, which is arranged at the edge of the base carrier 1, and with which the signal zone of the MCM makes contact with the outside. Starting out from the signal connection contact surfaces 3, the signal conductor tracks 2 lead to signal contact surfaces 4, which serve for contacting signal semiconductor components 11. These signal semiconductor components 11 can be housed or unhoused chips. In FIG. 1, only a single signal semiconductor component 11 is depicted. It goes without saying, that the signal zone can be as complicated as required and will be provided with the number of conductor tracks 2 and signal cemiconductor components 11 required for the application purposes. The contacting of the signal semiconductor components 11 and the deposition of the signal conductor tracks 2 and of the contact surfaces 3 and 4 is well known. From the signal semiconductor component 11, additional signal conductor tracks or control lines 8 lead to the power zone of the MCM. These control lines 8 are in immediate contact with corresponding power contact surfaces 7. The power contact surfaces 7 are electrically isolated from other power contact surfaces 7a, which are connected with the power conductor tracks 5. The power conductor tracks 5 on the edge of the base carrier 1 lead to power connection contact surfaces 6.

The material of the base carrier 1 depending on the application case can consist of fibre-glass reinforced plastic material (construction in the sense of an MCM-D) or of another suitable material (e.g., an electrically insulated metal). In the embodiment illustrated, the conductor tracks 2, 8 and 5 are respectively arranged in a single layer. A multi-layered arrangement can also be provided.

The connection contact surfaces 3 and 6 serve for the electrical connection of the complete MCM with the environment (e.g., motors to be driven, superordinate computers, sensors, etc.).

In the illustrated exemplary embodiment, the signal conductor tracks 2 are approx. 5 to 10 micrometers thick and the power conductor tracks approx. 0.6 to 0.7 mm thick, The width of the power conductor tracks is also a multiple of the width of the signal conductor tracks 2. In the depicted exemplary embodiment, the contact surfaces 7, 7a and 6 have the same height as the power conductor tracks 5. Mounted onto the contact surfaces is a power electronics component 12.

Because a large number of signal semiconductor components 11 and/or only individual power electronics components 12 generate relatively high temperatures, great significance has to be attached to good heat dissipation. For this purpose, in the zones free of conductor tracks 2, 5 and contact surfaces 3, 4, 6, 7, 7a, at least, however, in the power zone, heat conducting elements 9 can be provided. The heat conducting element 9 illustrated in FIG. 1 is arranged between the power contact surfaces 7, 7a and is in a beat conducting contact with the bottom side of the power electronics component 12. For this purpose, the base carrier 1 is breached in such a manner, that the heat conducting element 9 passes through the base carrier 1 and thus makes a good heat dissipation to the reverse side of the base carrier 1 possible. The eduction of the heat then can take place in the most diverse and varied manner.

The control lines 8 in preference consist of the same material as the power contact surfaces 7, so that a tight connection without any interfering interfaces or connections is created. The high density of integration, which is achievable through the arrangement on the base carrier 1, permits previously inconceivable possibilities of the MCM technology.

In preference, the manufacture of these structures is effected in several steps through photo-lithographic processes in combination with galvanic deposition, so that independently of one another the signal zone and the power zone are produced. The transition, free of any interference, takes place at the interfaces.

In the following, on the basis of the FIG. 2 a second embodiment of an MCM is explained in more detail. Hereinafter, only the essential differences to the preceding exemplary embodiment are dealt with. For this reason, the same reference numbers designate the same or equivalent components. A corresponding description is transferable.

Figure 2:
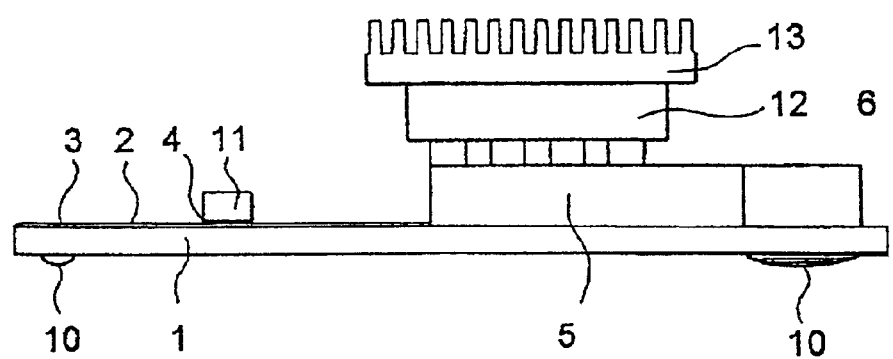
FIG. 2 a second embodiment of an MCM in a side view.

The second embodiment in accordance with FIG. 2 essentially comprises two great differences. The contact surfaces 3 and 6 are in connection with the reverse side of the base carrier 1, in which conductor track sections not depicted in more detail pass through the base carrier 1 at this point. Through this, contact elevations 10 are produced on the reverse side, and correspondingly take over the task of the connection contact surfaces 3 and 6. By means of the arrangement of the contact elevation 10 on the reverse side of the base carrier 1, these can be designed with the same height, however, with a differing surface area, as a result of which the contacting of the MCM is very much simplified. The contact elevations 10, e.g., can be provided with so-called solder bumps (i.e., with elevations of soldering tin with the shape of segments of a sphere). In this manner it is assured, that the complete MCM in a single manufacturing step is simultaneously fixed onto a corresponding substrate and is capable of being electrically contacted by it.

The second difference consists of the fact, that on the electronics component 12 a heat sink 13 is positioned, which takes care of a corresponding heat dissipation. In order that this heat sink 13 does not increase the volume of the complete superstructure to too great an extent, it preferably is a body, the cooling structures of which consist of geometrical shapes (walls, columns, pyramids, etc.) with a high aspect ratio, i.e., with a great ratio of structural height to structural width. In this manner it is ensured that the heat sink 13, in case of a very small overall height (e.g., 0.5 mm), provides a very large cooling surface area (e.g., in the case of a design of the cooling structures as columns 0.4 mm high a cooling surface area of 25 cm$^3$ per 1 cm$^2$ of base surface area).

In the case of superstructures of MCMs of this kind, over and above this there is the possibility of protecting the signal semiconductor components 11 and, in particular, the power electronics components 12 from mechanical effects from the outside, e.g., in that housings are provided or an encapsulation of the elements is implemented.

Figure 3:
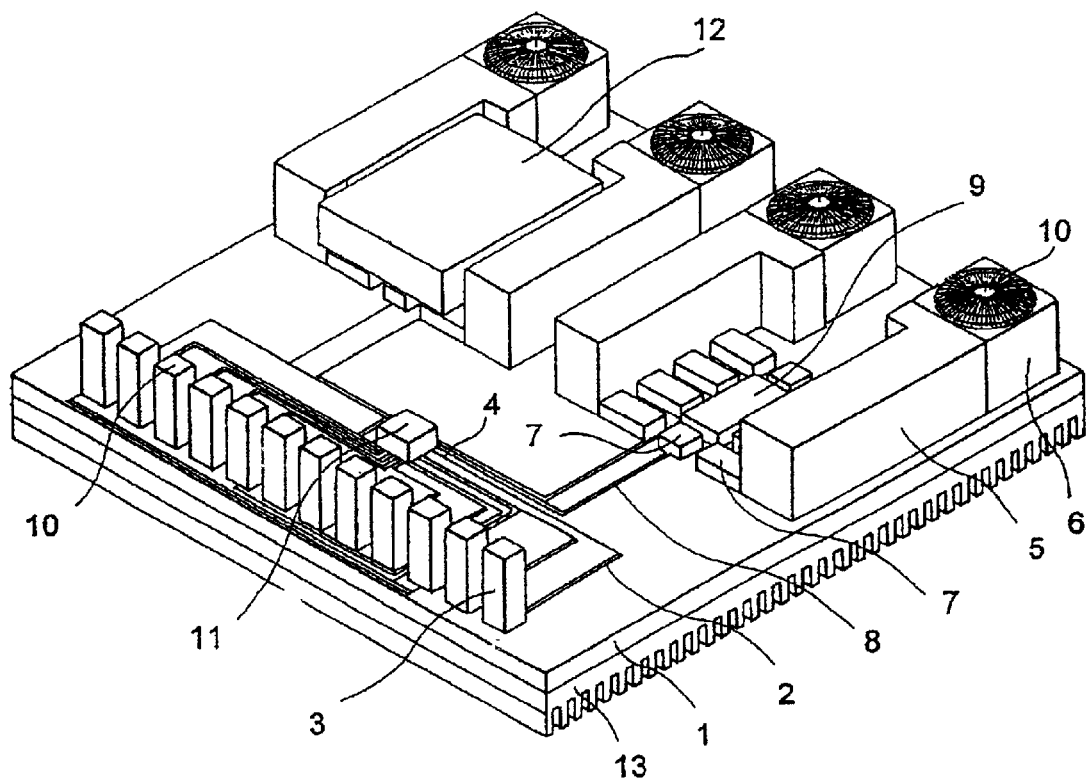
FIG. 3 a third embodiment of an MCM in a perspective view.

Also in the case of the exemplary embodiment explained in the following in accordance with FIG. 3, only the essential differences are dealt with, for which reason the preceding description is made reference to in complement.

Here the power connection contact surfaces 6 have the same height as the signal connection contact surfaces 3. For this purpose, the signal connection contact surfaces 3 are designed as columns. These too, can be provided with contact elevations 10, so that a uniform height results. The power conductor tracks 5 in this almost have the same height as the power connection contact surfaces 6, while in contrast the power contact surfaces 7 and 7a are less thick. In doing so, however, it is assured that the overall cross section of the power contact surfaces 7a is adequate for the power transmission. Also, the heat conducting element 9 is correspondingly adapted according to the height of the power contact surfaces 7, 7a. The difference in height of the power contact surfaces 7, 7a and the power conductor tracks 5 is calculated such that a countersunk installation of the power electronic components 12 can be implemented. The whole superstructure of the MCM apart from the countersunk installation of the power electronics components also provides the possibility that it can be installed with its top side facing downwards. In doing so, once again the installation of the connection contact surfaces 3, 6 with the same height alleviates the contacting. By means of this kind of assembly of the complete MCM, a complete protection of the semiconductor components 11, 12 against mechanical damage results, so that these—if at all—only have to be protected against humidity and harmful chemicals with a thin passivation layer.

The heat conducting elements 9 once again pass through the base carrier 1 and are in connection with a heat sink 13, which is located on the reverse side of the base, carrier 1. The heat sink 13 in preference once again comprises cooling structures made of geometrical shapes (walls, columns, pyramids, etc.) with a high aspect ratio. Because this type of heat sink 13 makes available an extremely large cooling surface area, the installation with the top side facing downwards does not present the danger of overheating, even if these components are thereupon integrated in closed-off units, because the heat is adequately dissipated to the outside.

Figure 4:
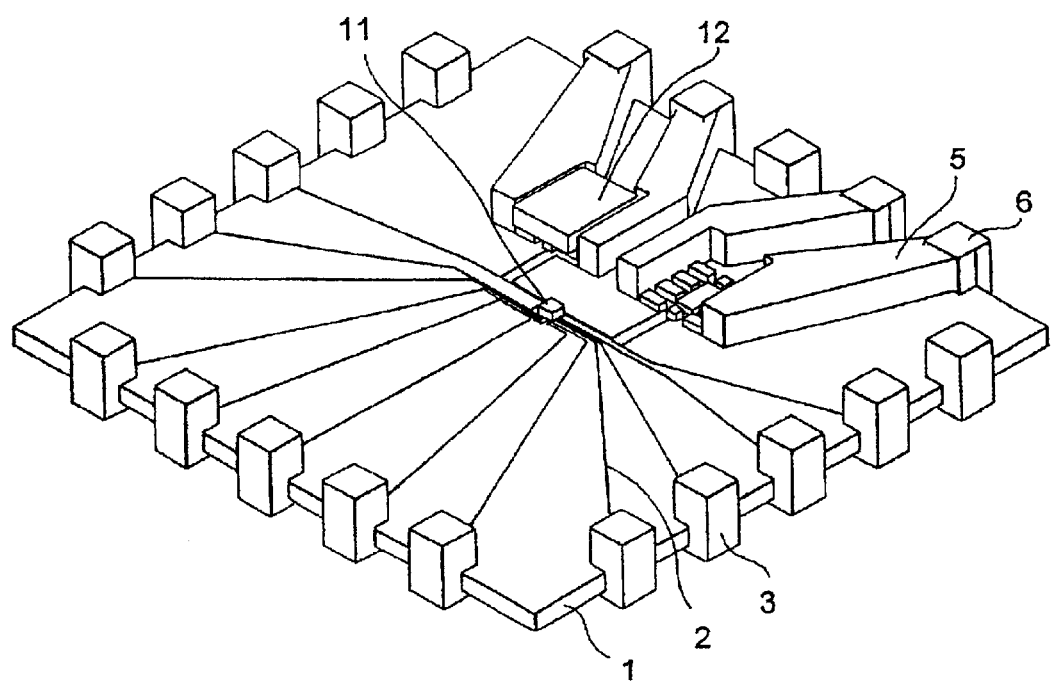
FIG. 4 a fourth embodiment of an MCM in a perspective view.

Also in the case of the exemplary embodiment in accordance with FIG. 4, only the most significant differences to the preceding exemplary embodiments are dealt with, for which reason here too, reference is made to the description above with respect to structurally identical elements. In the case of this exemplary embodiment, all signal connection contact surfaces 3 and power connection contact surfaces 6 are designed as column contacts at the edge of the base carrier 1. This arrangement corresponds to a standardisation, so that the MCM as an "intelligent power module" can be plugged into bases available on the market as standard components.

In FIG. 4 it is also very clearly evident, that the routing of the power conductor tracks 5 can be designed in any way required, so that the predefined positions of the connection contact surfaces 6 can be reached. The base carrier 1 and the outside connection contact surfaces 3 necessary for the contacting of the whole MCM can be constructed and shaped in such a manner, that the desired standard geometry is provided. The embodiment according to FIG. 4, for example, corresponds to a so-called "chip-carrier" module (PLCC module) with 15 contact points on its edge. In a similar fashion, without any problem PLCCs with 20, 28, . . . 84 poles or PGA-compatible superstructures or any other'standard superstructures can be made available. In, such cases, where the cross sections of the individual standard contacts is not sufficient to conduct the necessary power to the power electronics components 12, several power conductor tracks for one and the same power contact surfaces 7a can be split-up over several power connection contact surfaces 6 designed as standard contacts, so that overall a sufficiently great conductor cross section is obtained.

What is claimed is:

1. A multi-chip-module comprising: a base carrier (1), on which, at least in some areas, signal conductor tracks (2, 8) arranged at least in a single layer and signal contact surfaces (4) are arranged, and with at least one semiconductor component (11) connected with signal conductor tracks (2) and signal contact surfaces (4) operating in the signal range, wherein, additionally, on the base carrier (1), at least in some areas, power conductor tracks (5) and power contact surfaces (7, 7a) are arranged in at least a single layer, at least one power electronics component (12) operating in the power range is provided, which is connected with at least one power conductor track (5), at least one power contact surface (7, 7a) and at least one signal conductor track (2, 8), and the power conductor tracks (5) have a larger cross section than the signal conductor tracks (2) at least on the basis of greater thickness dimensions.

2. The multi-chip-module in accordance with claim 1, wherein the at least one signal conductor track (2, 8) leading to a power electronics component (12) essentially seamlessly verges into a power conductor track (5) and/or power contact surface (7).

3. The multi-chip-module according to claim 1, wherein the height of at least one of the power conductor tracks (5) and the power contact surfaces (7, 7a) is 2 to 300 times greater than the height of one of the signal conductor tracks (2, 8) and the signal contact surfaces (4).

4. The multi-chip-module according to claim 1, wherein the ratio of the conductor cross section of a power conductor track (5) and/or power contact surface (7, 7a) to the conductor cross section of a signal conductor track (2, 8) amounts to 2 to 1000, in preference 80 to 400.

5. The multi-chip-module according to claim 1, wherein the ratio of height to width of a power conductor track (5) and/or power contact surface (7, 7a) is situated in the range of 0.1 to 10, in preference 1 to 4.

6. The multi-chip-module according to claim 1, wherein at least one power conductor track (5) merges into several power contact surfaces (7a) for the common contacting of a power electronics component (12).

7. The multi-chip-module according to claim 1, further comprising signal connection contact surfaces (3) and power connection contact surfaces (6) for connection to external devices, wherein the signal connection contact surfaces (3) and the power connection contact surfaces (6) essentially are of the same height.

8. The multi-chip-module according to claim 1, wherein signal connection contact surfaces (3) and power connection contact surfaces (6) are arranged on the side of the base carrier (1), which is opposite the semiconductor components (11) and power electronics components (12) (reverse side), wherein the connection contact surfaces (3, 6) are electrically in connection with the opposite side (front side) by means of conductor track sections passing through the base carrier (1).

9. The multi-chip-module according to claim 1, wherein the dimension, which results from the height of a power conductor track (5) minus the height of a power contact surface (7a) electrically in connection with this power conductor track (5), is either the same or greater than the height of the power electronics component (12) contacting this power contact surface (7a).

10. The multi-chip-module according to claim 1, wherein on the base carrier (1) at least one heat conducting element is jointly arranged, which is in a thermally conducting connection with a power electronics component (12).

11. The multi-chip-module according to claim 1, wherein a heat exchanger device (13) is directly thermally conductively connected with a power electronics component (12).

12. The multi-chip-module according to claim 1, wherein the signal connection contact surfaces (3) and the power connection contact surfaces (6) are grouped and arranged on the base carrier (1) in such a manner, that the module is capable of being inserted into a standardised base.

13. The multi-chip-module according to claim 10, wherein the at least one heat conducting element (9) is connected with a heat exchanger device (13).

14. The multi-chip-module according to claim 13, wherein the heat exchanger device (13) is located on the reverse side of the base carrier (1) and the heat conducting element (9) passes through the base carrier (1).

15. The multi-chip-module according to claim 13, wherein the heat exchanger device (13) comprises fine cooling ribs with a ratio of height to width of 0.1 to 10, in preference 1 to 4.

* * * * *

UNITED STATES PATENT AND TRADEMARK OFFICE
CERTIFICATE OF CORRECTION

PATENT NO. : 6,788,546 B1
DATED : September 7, 2004
INVENTOR(S) : Phillipe Steiert et al.

It is certified that error appears in the above-identified patent and that said Letters Patent is hereby corrected as shown below:

Title page,
Item [57], ABSTRACT, replace with the following:
-- A multi-chip-module includes a base carrier on which signal conductor tracks and signal contact surfaces arranged at least in a single layer are located, and with a semiconductor component operating in the signal range and connected with the signal conductor track and signal contact surfaces. A high degree of integration is achieved with a multi-chip-module of this type. In some areas on the base carrier power conductor tracks and power contact surfaces arranged in at least one layer are located. Furthermore, at least one power electronics component, operating in the power range, is provided, which is connected with at least one power conductor track, at least one power contact surface and at least one signal conductor track. The power conductor tracks have a larger cross section than the signal conductor tracks at least on the basis of greater thickness dimensions. --

Signed and Sealed this

First Day of February, 2005

JON W. DUDAS
*Director of the United States Patent and Trademark Office*